United States Patent [19]

Dias et al.

[11] Patent Number: 4,977,537
[45] Date of Patent: Dec. 11, 1990

[54] DRAM NONVOLATIZER

[75] Inventors: Donald R. Dias; Francis A. Scherpenberg, both of Carrollton, Tex.

[73] Assignee: Dallas Semiconductor Corporation, Dallas, Tex.

[21] Appl. No.: 248,865

[22] Filed: Sep. 23, 1988

[51] Int. Cl.$^5$ .................... G06F 12/16; G11C 11/40
[52] U.S. Cl. ........................... 364/900; 364/965.79; 364/964.9; 364/948.5; 364/968; 365/222; 365/228; 365/229
[58] Field of Search ... 364/200 MS File, 900 MS File; 365/222, 226, 228, 229; 331/111; 320/43

[56] References Cited

U.S. PATENT DOCUMENTS

| 4,015,219 | 3/1977 | Kawagoe et al. |
| 4,313,180 | 1/1982 | Mochizuki et al. ............... 365/222 |
| 4,317,054 | 2/1982 | Caruso et al. |
| 4,384,350 | 5/1983 | Lee et al. ............................ 365/229 |
| 4,406,013 | 8/1983 | Reese et al. |
| 4,412,284 | 10/1983 | Kerforne et al. ................... 364/200 |
| 4,594,565 | 6/1986 | Barrerras |
| 4,607,238 | 8/1986 | Kohsiek ............................... 331/111 |
| 4,628,457 | 12/1986 | Manduley ........................... 365/226 |

FOREIGN PATENT DOCUMENTS 54-37671  3/1979  Japan .
57-97721  6/1982  Japan .

OTHER PUBLICATIONS

Motorola Memory Data Manual, 1982, pp. 2-72.
Curtis, W., Silicon Complication, IEEE Potentials, May 1986, pp. 27-29.
Application Note from National Semiconductor, published in 1977, reprinted in *Analog Integrated Circuits* (ed. Grebene 1978) pp. 173-178.
Brokaw, "A Simple Three-Terminal IC Bandgap Reference," 9 J. Solid State Circuits 388 (Dec. 1974), reprinted in *Analog Integrated Circuits*, (ed. Grebene 1978) pp. 167-172.
Motorola Application Note, from Pages 4:69ff of the M6800 *Microprocessor Application Manual* (1975).

Primary Examiner—Gareth D. Shaw
Assistant Examiner—John Loomis
Attorney, Agent, or Firm—Worsham, Forsythe, Sampels & Wooldridge

[57] ABSTRACT

A nonvolatile memory subsystem includes DRAMs and a battery-backed controller chip. The controller chip monitors the system power supply level to ascertain power fault conditions. When a power fault is detected, the controller provides the DRAMs with both a regulated supply voltage and appropriately timed refresh signals.

After the system power supply has returned to specification, the controller continues to generate refresh control signals until the commands it to stop.

43 Claims, 8 Drawing Sheets

DRAM NONVOLATIZER

BACKGROUND AND SUMMARY OF THE INVENTION

The present invention relates to computer systems, and particularly to computer systems using large numbers of dynamic random access memories ("DRAMs").

DRAMs are the lowest-cost type of semiconductor memory. DRAMs are therefore used in a very wide variety of computer systems, and in other electronic systems as well.

However, DRAMs require refreshing. Information is represented by the presence or absence of electric charge in each DRAM cell. For example, a "1" might be written into a DRAM cell by storing a packet of charge in the cell, and a "0" by not storing a packet of charge. However, these packets of charge are very small, and they rapidly leak away. Depending on various factors, the data stored in a DRAM cell may become unreadable within less than 1/10th of a second after it has been written.

Therefore, to maintain stable storage of data, it is necessary to periodically read out each of the cells in the chip, amplify the data signal from the cell, and write the amplified data signal back into the cell. This function is well known to those skilled in the art of computer memory system design. Many chips are available to perform "memory management" functions, such as determining when another refresh cycle must be initiated for the DRAM chips in a memory bank.

Unless a DRAM receives refresh signals and power, the stored data will be lost. Therefore, the data in a conventional memory bank composed of DRAMs will disappear whenever a significant power interruption occurs. It would be highly desirable to avoid this vulnerability to power interruption, but no commercially feasible way to accomplish this has yet been presented.

SRAMs (static random access memories), like DRAMs, are volatile. That is, SRAMs too will lose their data as soon as power is interrupted. However, a relatively recent development has permitted systems using SRAMs to achieve nonvolatility. The Smart-Socket (TM), marketed by Dallas Semiconductor Corporation, is a socket which includes a small lithium battery and a controller circuit, so that a CMOS SRAM can be maintained in standby status when the system power supply fails. This product has proven to be extremely useful to system designers.

DRAMs, unlike SRAMs, do not have a very low power standby mode, and do require refresh operations. These factors make it more difficult to implement battery backup for DRAM memory. Another difficulty is that DRAMs tend to be more sensitive to power supply voltage fluctuations than SRAMs are.

The present invention enables memory subsystems where standard commercial DRAMs can be used, but wherein the data in the DRAMs is nonvolatile, i.e. is safeguarded against power failure. The present application sets forth a number of innovative teachings which permit DRAM nonvolatility to be achieved. Some significant ones of these teachings are as follows. Of course, most of these innovative teachings could be applied independently.

1. The DRAM chips used are preferably those where row addresses for refresh need not be externally supplied. Thus, for example, chips such as the first generation 256K DRAMs would not be used. Instead, standard one megabit chips, or later-generation 256K chips could be used, where refresh is triggered (e.g.) by a CAS-before-RAS, and the chip has an internal counter which points to the next row for refresh.

2. In the presently preferred embodiment, one controller chip is used with each bank of nine DRAMs, to provide nonvolatility. This approximate ratio of controller chips to memory chips turns out to be particularly advantageous. However, less preferably, more or fewer memory chips per controller could be used.

3. When the system power has been interrupted, power is supplied from a battery whose operating voltage is higher than the highest normal value of the system power supply.

4. On power failure, a burst mode refresh cycle is preferably initiated immediately. (A "burst mode" refresh cycle is one where all of the rows are refreshed one after another, as rapidly as possible.)

5. A bandgap-regulated reference voltage generator is used to accurately regulate the standby power supply voltage supplied to the DRAM chips. This voltage is set near the high end of the permissible range. The regulator has significant hysteresis. A trimmable resistor network permits high absolute accuracy. The use of a high battery voltage and precise regulation also means that a wide range of battery voltages can be tolerated. A relatively large capacitor is preferably tied to the regulated power supply output of each controller chip. This permits an effective output impedance which is lower than that of the battery.

6. Both high-voltage and low-voltage NMOS and PMOS transistors are used. This permits a higher voltage to be used on the battery, while still providing low-impedance switches. (Low-impedance switches are needed to avoid clock skew in the RAS* and CAS* signals, which are received from the system and passed on to the DRAM bank during normal operation. These RAS* and CAS* signals may have to drive as much as 300 picoFarads of capacitive load in a bank of nine DRAMs).

7. A battery usage counter is preferably included in the controller chip. Thus, a system status output pin can be used to indicate that a battery is nearing the end of its lifetime (or has failed catastrophically). In addition, the battery lifetime counter data can be read out or rewritten by the system.

8. The standby functionality is selectable. Therefore, the system may select some memory banks to be nonvolatile, and command others not to be nonvolatile. This means that the power in the standby batteries can be conserved during storage and shipping, or whenever the system determines that the DRAM data does not need to be protected.

9. When power is restored, the system must request the control chip to hand back control. This assures a clean hand-off on power up, even if the system power supply is momentarily interrupted during the power-up transition. As soon as the supply voltage has been restored, a continuous series of refresh commands is initiated. Thus, when the system resumes control, the DRAM chips will already be maximally refreshed.

10. To generate the RAS* and CAS* signals with appropriate timing during battery backup operation, an oscillator is used which is voltage and temperature insensitive.

11. Floating well devices are used in the local power supply regulator, to assure that the devices are insensitive to the sign of voltage difference between the system power supply and the standby power supply.

The present invention provides numerous advantages, including at least the following:

Nonvolatile memory modules can readily constructed using common commercial DRAM chips. This provides very low cost nonvolatile memory modules of large capacity.

Moreover, the nonvolatile memory modules thus supplied can be written to and read from extremely rapidly. (One of the problems with using EPROM or EEPROM memory is that the write speeds are extremely slow.)

The nonvolatile memory modules provided by the present invention are highly architecturally compatible with many existing DRAM-based archittectures. Thus, with many system architectures, nonvolatile memory modules according to the present invention can be directly plugged in the place of a conventional DRAM memory module. By contrast, conventional nonvolatile memory technologies require different architectural environments than DRAM technology. Thus, this feature of full architectural compatibility can be extremely important to system designers.

Computer, consumer, or telecommunication systems built using such nonvolatized DRAM memory modules have substantial advantages over comparable systems using conventional DRAM modules. For example, data loss due to common occurrences such as a user kicking a plug is eliminated. Moreover, data loss due to power-line spikes or dropouts is also eliminated. Optionally, a system may use not only nonvolatile DRAM modules as described herein, but also battery-backed power failure protection for all microprocessors and all other types of memory present in the system. This means that a system can be provided which is fully nonvolatized against power interruptions.

The various innovations described also provide a nonvolatile DRAM system which is as insensitive as possible to the phase of DRAM refresh cycles. That is, in systems built according to the innovative teachings disclosures herein, it does not matter whether a power failure occurs just after a particular memory bank has been refreshed, or just before that memory bank was due to be refreshed again.

The presently preferred embodiment also provides substantial advantages of reduced temperature dependence. The behavior of integrated circuits generally tends to be somewhat temperature-dependent. For example, normal logic elements, in a CMOS integrated circuit, will normally run somewhat slower at higher temperatures. In some contexts, this normal temperature-dependence can be very undesirable.

U.S. Pat. No. 4,406,013 has suggested a DRAM refresh generator which provides more frequent refreshing at higher temperatures. However, relatively complex circuitry is normally needed to accomplish this.

The present invention has the advantage of providing a very simple circuit which avoids increased delay at higher temperature.

BRIEF DESCRIPTION OF THE DRAWING

The present invention will be described with reference to the accompanying drawings, wherein.

DESCRIPTION OF THE PREFERRED EMBODIMENTS

The present invention will be described with reference to specific preferred embodiments thereof. However, it should be understood that these embodiments can be very widely modified and varied. The scope of the invention, as will readily be recognized by those skilled in the art, can be modified and varied to be incorporated in a tremendous variety of system contexts.

In the following discussion, the following signals are referred to. These signal names also appear in several of the Figures. In the following text, the logical complement of a signal will be represented with an asterisk. Thus, for example, CAS* (which is more often written with an overline, and pronounced as "CAS-bar") represents the complemented column-address-strobe signal, i.e. this signal goes low to indicate a column address strobe. Complemented signals are normally used to refer to column-address strobe, row address strobe, and write enable signals, since this corresponds to the polarity conventionally used.

BAT=Battery Input
TOL=VCCI Trip Point Select
PF*=Power Fail Output
A0-A9=Address Inputs from System
PCASI*=CAS* for Parity Bit Input from System to Controller
VSS=Ground
PCASO*=CAS* Output for Parity Bit to RAM
WEI*=Write Enable Input from System to Controller
WEO*=Write Enable Output from Controller to DRAMs
CASI*=CAS* Input from System to Controller
CASO*=CAS* Output from Controller to DRAMs
RASI*=RAS* Input from System to Controller
RASO*=RAS* Output from Controller to DRAMs
VCCO=VCC Output to DRAMs
VCCI=+5 Volt Input from System (system power supply)

The controller chip 500 is a CMOS circuit designed to control DRAMs such that information stored in memory is retained and protected during power failure. The controller chip accomplishes this by monitoring the system power supply for an out of tolerance condition. When such a condition occurs, the DRAM is disconnected from the system control, and the power supply for the DRAM is switched from VCC to the battery. Refresh control is maintained by the controller chip until the power is back up and in limits. At this time, refresh control can be returned to the system, but only after the system has written a particular serial sequence on address lines A0, A1 and A2. To conserve battery energy during periods of shipping and storage, an additional serial sequence is available which disables refreshing and power switching on the next power failure.

OPERATION—NORMAL MODE

Under normal operation, the +5 volt system power supply line (VCCI) will be operating within the tolerance limits set by pin 3 (TOL). If pin 3 is connected to VCCO, the controller chip will operate in the normal mode down to 4.5 volts. When pin 3 is grounded the controller chip will operate in the normal mode down to 4.75 volts. During normal operation the RAS*, CAS*, PCAS* and WE* inputs are directly connected to the respective outputs with a maximum propagation delay of 15 nsec. The battery input and charge inputs are used to charge the battery while in normal mode. The PF* power fail output is at high level and address inputs A0, A1 and A2 are monitored for software switch inputs.

OPERATION—POWER LOSS AND DATA RETENTION

When the VCCI power begins to drop, a bandgap-reference precision comparator senses this change. Depending on the level of the tolerance set by pin 3, a power fail signal will be generated as VCC falls below 4.75 V or 4.5 V. The power fail output signal is driven low at this time, and will stay low until VCC is restored back to nominal conditions. When the data save mode is turned on, the controller chip disconnects all control inputs and starts driving the RAS*, CAS*, PCAS* and WE* outputs. The VCCI input is disconnected from VCCO, and the regulated battery supply is connected. A rapid CAS* before RAS* refresh cycle is generated at a cycle time of 350 ns maximum. This rapid refresh continues for 520 consecutive cycles. (Of course, these times are determined by the functional requirements of the DRAM chips being used.) After the rapid refresh burst is complete, subsequent rapid refreshing bursts occur at 8 ms intervals. This continues until VCC returns to normal levels *and* the system signals the controller chip that it is ready to assume refresh duties. The WE* output is held at the high (inactive) level from the time power fail is detected until the system assumes refresh duties. Thus, any glitches which may appear on the WE line during power-up will not disrupt data.

OPERATION—POWER UP AND RETURN TO NORMAL MODE

When the +5 volt VCC Power Supply is returned to the system, such that VCC exceeds 4.5 V or 4.75 V (depending on the user-defined tolerance), the VCCI input is immediately reconnected to the VCCO Output pin, while the regulated battery supply is internally disconnected from VCCO. The controller chip now generates the rapid CAS* before RAS* refresh mode without interval delay, at a cycle time of 350 ns maximum. This rapid refresh mode will continue until the system signals that it is ready to assume refresh of the DRAM. (This assures that, when hand-off to the system occurs, the memory chips will be in a maximally refreshed state.) Refresh duties are shifted from the controller chip to the system when a software switch is set by sending a 24 bit long pattern on address lines A0, A1 and A2. The address pattern is entered into the controller chip on the falling edge of CAS*, provided that setup and hold times are met. When the 24th bit is correctly entered, the system will have full access to RAM and must handle refresh requirements. RAM read and write cycles can resume in any mode after the software switch is correctly set.

OPERATION—DATA SAVE MODE

Two other software switches exist which are used to turn data save on and off. When data save is on, the controller chip will (as described above) refresh the DRAM, and supply VCCO power, whenever VCCI is in an out of tolerance condition. When data save is off, refreshing does not occur and VCCO is not switched. Both switches can only be set while power is within nominal limits and after the system is in control of RAM. The software switches are set by entering another 24 bit long pattern, as described above. Turning on and off the data save mode can save battery energy during periods of storage and shipment, and can also provide a means to erase memory when nonvolatility is not desired.

CIRCUIT IMPLEMENTATION

The circuit implementation used in the presently preferred embodiment will now be discussed in greater detail.

Figure 5:
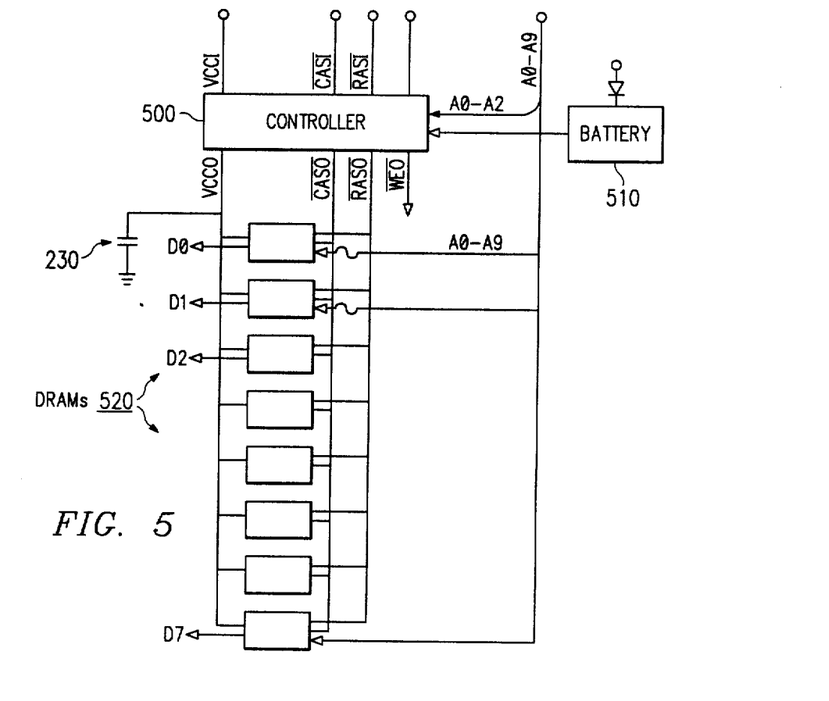
FIG. 5 shows a single memory bank, containing a controller chip like that of FIG. 1 together with a battery, a capacitor, and a set of nine DRAMs.

FIG. 5 shows an overview of a memory subsystem according to the presently preferred embodiment. A controller chip 500 receives a system power supply voltage VCCI, and refresh control signals CASI* and RASI*, from the system. The controller chip 500 also receives an output voltage, of 6 to 10 volts, from a battery 510. The bank of DRAM chips 520 receive their row address strobe (RAS*) and column address strobe (CAS*) control signal inputs from the controller 500. In addition, the chips 520 receive their power supply (labelled VCCO) from the controller 500. The chips are also connected to address lines A0-A9. (Ten address lines are indicated, for a system where the DRAM chips 520 are each 1M×1 DRAMs. Of course, if other sizes were used for the chips 520, more or fewer address lines might be needed.) Lines A0-A2 are also connected, in parallel, to the controller 500. As will be discussed below, the controller 500 scans these lines to detect certain control signals.

Each of the DRAM chips 520 has ten address line inputs, connected to address lines A0-A9, one column address strobe input (connected to line CAS0*), and one row address strobe input (connected to line RAS0*). For normal read operation, as is conventional in the DRAM art, the chips 520 recognize the address data on lines A0-A9 as a row address when the row address strobe line shows a falling edge. Similarly, the data on lines A0-A9 is recognized as a column address when, after a row address has been latched in, the column address strobe line shows a falling edge. The combination of a ten bit row address with a ten bit column address uniquely defines one cell in the one megabit array, and the data from this one cell is provided as output.

To write data into the DRAMs 520, a very similar operation is performed. However, not only must the row and column address data be latched into the chips 520, but also a write enable line must be activated. The write enable control signal provided by the system is shown as input WEI* to the controller 500, and the controller provides an output line WEO* which is connected to the write enable inputs of each of the DRAMs 520. Thus, when a RAS* before CAS* sequence occurs, each of the DRAM cells will take the data which it finds on its own data line, and write that data into the cell indicated by the row and column addresses just received.

To perform refresh operations, the RAS* and CAS* signals are sent in the opposite sequence. That is, when the peripheral logic on one of the DRAMs 520 detects a CAS* before RAS* sequence, it recognizes that a refresh operation is being commanded.

In the presently preferred embodiment, the DRAMs 520 keep an internal counter which indicates which row is to be refreshed next. Thus, whenever one of these DRAM chips receives a CAS before RAS sequence, it ignores lines A0–A9, and simply refreshes whichever one of its rows is due to be refreshed next. (By contrast, some DRAMs require a row address, for the next row to be refreshed, to be specified by the system.)

The embodiment shown uses eight DRAM chips 520 in parallel. However, many memory subsystems use nine such DRAMs in parallel, even though only eight bits of data are output. The ninth DRAM permits parity generation and check operations to be performed. In memory subsystems of this kind, an additional control signal PCAS* is used. In a system like that shown in FIG. 5, if parity generation and check is used, the additional control line PCAS* is also routed through the controller 500.

Figure 1:
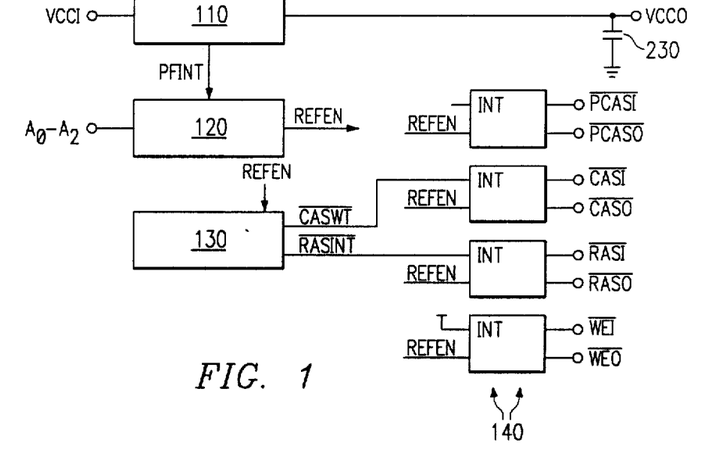
FIG. 1 shows an overall block diagram of the controller chip as configured in the presently preferred embodiment.

FIG. 1 shows the relationship of the key portions of the controller chip 500. In addition to the mode select logic 120, power control block 110, and refresh control logic 130, note that four buffer/multiplexers 140 are provided. These four multiplexers select whether the control signals generated in the controller chip 500 will be substituted for the signals received from the system. These buffer/multiplexers arbitrate the PCAS*, CAS*, RAS*, and WE* signals, as indicated by the REFEN signal. Mode select logic 120 can activate line REFEN, to indicate that a power failure has occurred and that nonvolatility has been enabled.

Note that the power control block 110, in addition to providing voltage regulator functionality when required, or connecting the VCCI input to the VCCO output when required, also tests the VCCI and BAT inputs to determine whether a power failure has occurred. That is, the VCCI signal is tested against the bandgap-derived reference voltage, and power failure is indicated (signal PF*) if the system power supply becomes lower than a predetermined level. Battery failure (signal BF*) is indicated if the battery voltage ever become less than the system supply voltage.

Figure 2A:
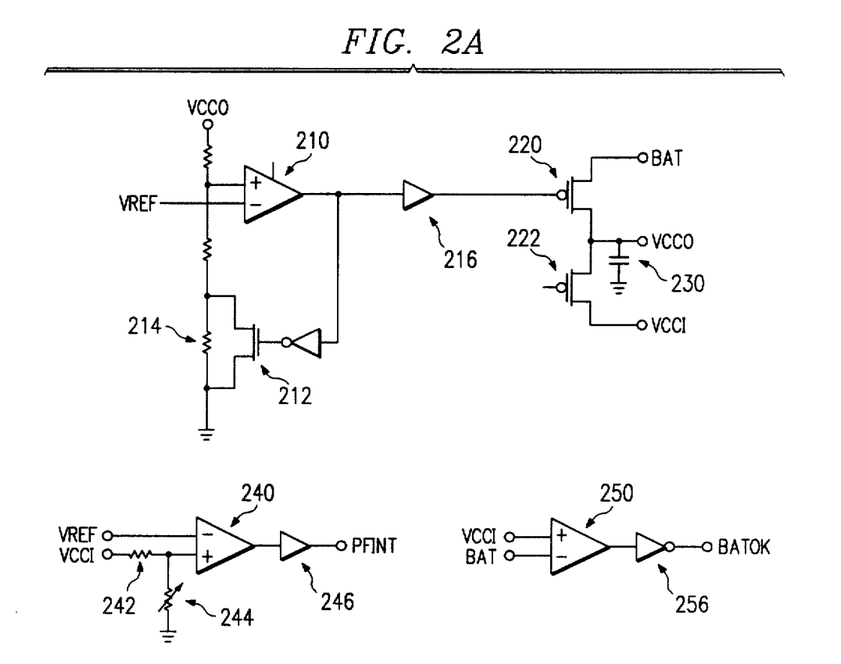
FIG. 2A shows some key portions of the voltage regulator circuitry used in the presently preferred embodiment.

FIG. 2A shows key portions of the power control block 110. For clarity, various minor details, which will be immediately obvious to those of ordinary skill in the art, have been omitted. For example, various buffers, level shifters, etc., have not been separately shown, or have been shown only in condensed form. Moreover, the specific logic gates used to implement some of the logical relations described have not been separately shown, since their implementation is believed to be obvious to those of ordinary skill in the art.

In FIG. 2A, a first comparator 210 performs the basic power regulation function. Inputs to this comparator are the reference voltage $V_{REF}$, and a scaled voltage which is proportional to the regulated supply voltage VCCO. Note that the resistor divider network used to provide the scaled voltage input to comparator 210 includes one resistor 214 which can be switched out by pass transistor 212. The gate of this pass transistor is connected to the output of the comparator 210, so that a slight hysteresis is introduced into the output of the comparator. (In the presently preferred embodiment, about 40–50 mV of hysteresis results.)

The output of comparator 210 is connected through various buffer stages to transistor 220. Transistor 220 connects the VCCO line to the BAT line. Thus, whenever the VCCO voltage becomes too low, current is passed through transistor 220 to pull-up the voltage on line VCCO. Note that capacitor 230, tied to the regulated voltage line VCCO, helps smooth the output voltage. Preferably the transistor 220 is extremely wide, so that it provides the low impedance needed for a low effective source impedance on the VCCO line. (Of course, the capacitor 230 helps to lower the effective source impedance of the VCCO line.)

As described above, when the controller chip 500 does not have to provide a regulated power supply, the system supply voltage VCCI can simply be passed directly through to the DRAM supply voltage line VCCO. This accomplished by switching on transistor 222. Again, transistor 222 is very wide, to provide a low effective power supply impedance.

A second comparator 240 is used to detect when the system power supply VCCI is going down. Again, a resistor dividing network, shown schematically as resistors 242 and 244, is used to scale the system supply voltage VCCI for comparison with reference voltage $V_{REF}$. The resistor 244 is shown as a variable resistor, to indicate that (as described above) the voltage level on pin 3 can be used to set the tolerance level on the system power supply failure detection. That is, depending on the logic level on pin 3, failure can be detected when the system power supply has gone down to 4.5 volts, or when it merely gone down to 4.75 volts. The output of this comparator, buffered by stages 246, provides a logical signal PFINT. (A buffered version of this signal will be output as power fail detect signal PF*).

Similarly, a third comparator 250 is used to detect battery failure. The operation of this comparator, and following buffer stage 256, is very simple, since battery failure is simply detected whenever the system supply voltage VCCI exceeds the battery voltage BAT. The output of stages 256 is an internal logic signal BATOK. (This will provide an external signal BF*).

Figure 2B:
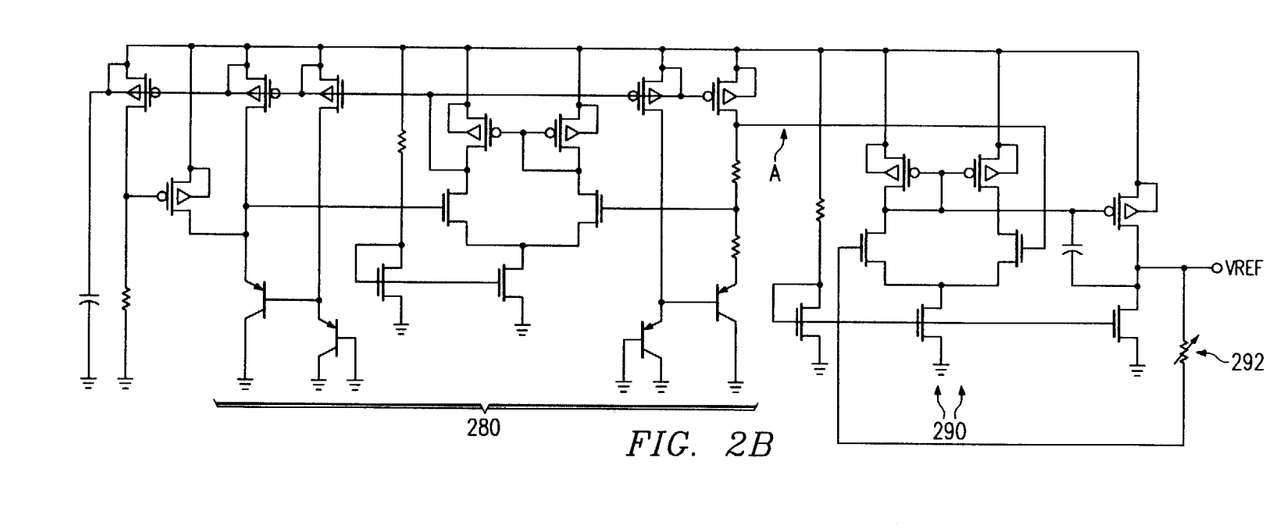
FIG. 2B shows additional portions of the regulating circuitry used in the presently preferred embodiment.

FIG. 2B shows key portions of the reference voltage generator 120. A conventional bandgap-referenced voltage reference circuit 280 provides a quite constant voltage of approximately 2.7 volts on node A. A low gain op amp stage 290 is then used to multiply this voltage by a small factor, to bring it up to three volts exactly. A trimmable resistor network (shown schematically as variable resistance 290), permits trimming to be performed, on a wafer-by-wafer or even a chip-by-chip basis, at the time of manufacturing, to assure that the reference voltage $V_{REF}$ is precisely accurate.

Figure 3:
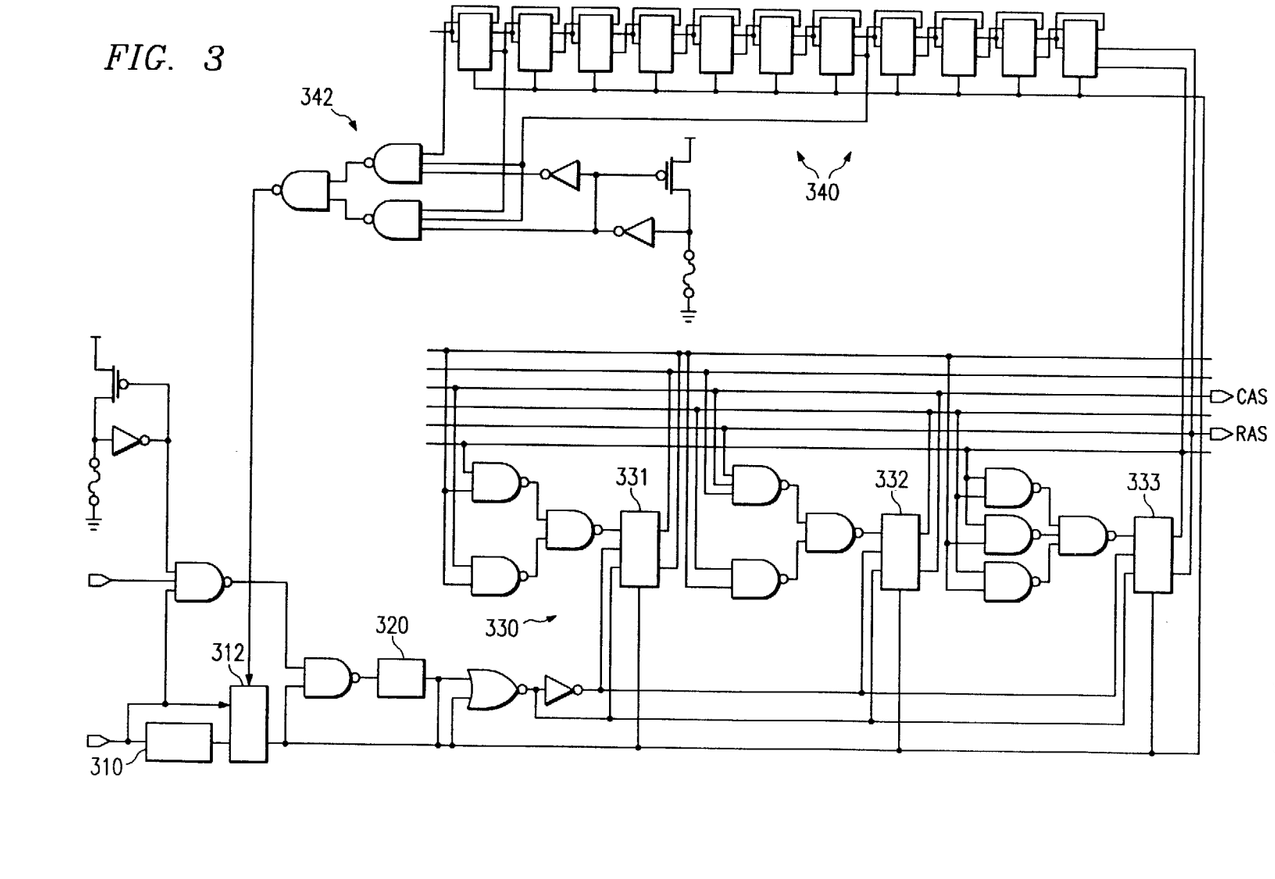
FIG. 3 shows key portions of the circuitry used to generate the refresh signals applied to the chips.

FIG. 3 shows key portions of the refresh control logic 130. Again, some minor details have been omitted for clarity.

A 125 Hz oscillator 310 maintains the basic interval for refresh burst mode cycles. When this oscillator emits a pulse, the output from flip-flop 312 enables a 20 MHz oscillator 320. The oscillator 320 provides the timing output for the individual refresh commands within the overall refresh cycle. The output of the 20 MHz oscillator 320 is provided to a logic generation circuit 330, which actually generates the CAS-before-RAS sequence which commands each DRAM to refresh another row.

The 330 is a state machine which takes seven periods to run through a full cycle. Therefore, if the oscillator 320 provides output pulses at 50 nanosecond intervals, the 330 will provide a CAS-before-RAS sequence every 350 nanoseconds. In the presently preferred embodiment, the oscillator 320 is programmable, so that its speed can readily be changed, up to 30 MHz if needed.

One of the outputs from the logic 330 goes to a counter 340. In the presently preferred embodiment, the counter 340 is configured using ten flip-flop stages. Logic 342, connected to the output of these stages, resets the flip-flop 312, and the output of flip-flop 312 now disables the 20 MHz oscillator 320. Moreover, the output of this flip-flop also resets the elements 331, 332, and 333 of the logic 330, and also resets all of the flip-flops in the counter 340.

Thus, every eight milliseconds, oscillator 310 outputs a pulse, which activates oscillator 320 to put out a burst of pulses at intervals of approximately 50 nanoseconds. The logic 330 is clocked by these pulses, and outputs CAS-before-RAS cycles at intervals of approximately 350 nanoseconds. The output of the logic 330 is also provided as an input to counter 340. Counter 340 disables the oscillator 320 after a predetermined number of pulses (either 1,032 or 520, in the presently preferred embodiment).

Figure 7:
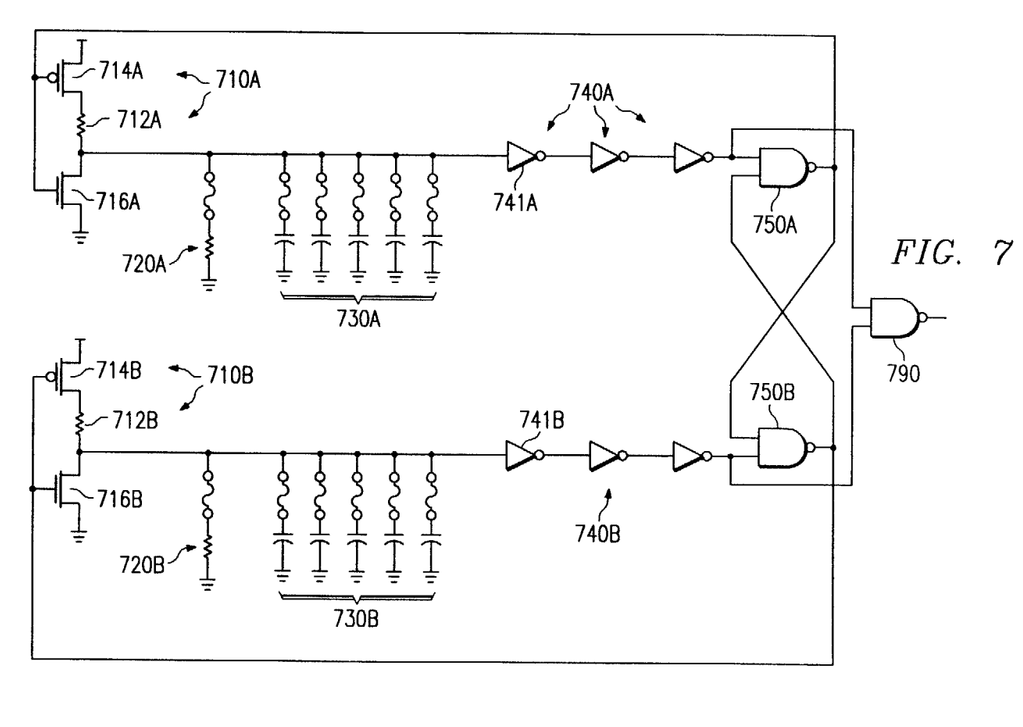
FIG. 7 shows the temperature and voltage insensitive oscillator used in the presently preferred embodiment.

FIG. 7 shows the circuitry of the voltage- and temperature-insensitive oscillator 320 used in the presently preferred embodiment. (A similar configuration is also used for oscillator 310, with subsequent dividers to provide a low-frequency output.

Note that this oscillator has two identical parts, one including components 710A-750A, and the other including components 710B-750B. Note that each of these halves of the oscillator includes a pull-up resistor 712 and a pull-down resistor 720, as well as loading capacitance 730.

The use of two sides to this oscillator, with cross-coupling of the two sides through NAND gates 750A and 750B, provides substantial advantages of voltage-independence.

The conventional way to implement voltage-indifference in an oscillator is to use an RC time-delay circuit which is both charged to and tripped at voltages which are resistor-scaled fractions of supply voltage VDD. The supply voltage terms in the resulting time equation are therefore cancelled. Normally, in an oscillator for such applications, a one-shot would be used, to trigger when a certain threshold voltage is reached in an RC timing circuit. When the one-shot triggers, the RC timing circuit is discharged, and the cycle begins again. However, the time delay in such a circuit is invariably sensitive to the width of the pulse provided by the one-shot. Since the width of pulse provided by the one-shot is voltage sensitive, some significant voltage sensitivity is inherent in such a design.

By contrast, the circuit organization shown in FIG. 7 avoids this. When pull-up transistor 714A is on, resistor 712A will pass more current than pull-down resistor 720A. The voltage at the input to inverter 741A will therefore increase, with a time constant which depends (as discussed below) on the value of capacitance 730A, and on the conductances of resistor 712A, resistor 720A, and transistor 714A, until inverter 741A changes state. At that point the input to NAND gate 750A goes low. Therefore, the output of NAND gate 750A will go from low to high. This will result in two things happening:

First, this high voltage will turn off transistor 714A, and turn on transistor 716A. Thus, the input to inverter 741A will be pulled low again, at a rate which depends on the value of capacitance 730A and the sum of the conductances of transistor 716A and resistor 720A. However, it is important to note that the time required for this pull-down action is not in the critical timing path. That is, at this point in time, the overall timing of the oscillator is dependent only on what happens in the B side.

In the B side of the oscillator, once the output of gate 750A goes high, the output of NAND gate 750B will go low. This means that transistor 714B will be turned on, and pull-up resistor 712B will begin to raise the voltage at the input to inverter 741B. The same charging process is repeated on the B side, until the B side reaches its trip point and fires the A side again.

Thus, the period of this oscillator is essentially entirely defined by the charging time of the two sides of the oscillator. The discharge time is irrelevant, since it is not in the critical timing path. This means that the voltage-dependence of a conventional one-shot is eliminated.

This organization is especially valuable at high frequencies, such as (in the presently preferred embodiment) where the user may desire the oscillator to operate at up to 30 MHz. In designing a conventional timing circuit, the one-shot pulse width must be made long enough to assure that the central node will be fully discharged under all circumstances. This can become a significant fraction of the total oscillator period in such a context.

A second significant feature in the circuit of FIG. 7 is the use of two types of resistors, with different TCR (temperature coefficient of resistance) values, for the pull-up resistor 712 and the pull-down resistor 720. This provides an effective time constant for the charging cycle which is more temperature-independent than could be achieved by an RC circuit using a single resistor.

The net effective conductance of resistor 712 is reduced by the conductance of resistor 720. Since the temperature-dependent resistance characteristics of these two resistors are slightly different, the use of this differential-conductance arrangement helps to provide an effective resistance which is more nearly temperature independent.

In the presently preferred embodiment, the pull-up resistors 712 are polysilicon resistors. These have a sheet resistance of approximately 30 ohms per square, and a positive temperature coefficient of resistance of approximately 1,000 parts per million per degree C. The pull-down resistors 720, in the presently preferred embodiment, are N-well resistors. These have a sheet resistance of approximately 1,000 ohms per square, and a positive temperature coefficient of resistance of approximately 4,000 parts per million per degree C.

To adjust the frequency of the oscillator, the quantity of the capacitance 730 is adjusted. In the presently preferred embodiment, laser-addressable fuses 731 are provided in series with each of the capacitors 732. Moreover, the capacitors 732 are preferably given different sizes, so that a wide range of values of capacitance can be precisely selected. In the presently preferred embodiment of the 20 MHz oscillator, MOS capacitors, with a specific capacitance of about 1.5 fF per square micron, are used. Five capacitors 732 are provided, with sizes from 100 to 1,600 square microns.

Finally, a NAND gate 790 (and following buffers, not shown) is used to provide a combined output from the A side and the B side of the oscillator.

Note that the first inverter 741, in the inverter chain 740, is preferably configured using long and wide transistors. In the presently preferred embodiment, transistors which are 200 microns wide and 100 microns long are used. This provides good analog gain in this stage, with reasonably low on-state series resistance. For comparison, pull-up transistor 714 is 100 microns wide, pull-down transistor 716 is 20 microns wide, and the other stages of the inverter chain 740 are 20 microns wide and 10 microns long.

More precisely, the instantaneous charging current, at the input to inverter 741, can be expressed as follows. In the following equations, $R_2$ stands for the resistance of pull-down resistor 720,
$R_1$ for the pull-up resistance (i.e. the sum of the resistance of pull-up resistor 712 and the on-state resistance of transistor 714),
$V_c$ for the voltage at the input to inverter stage 741,
C for the value of capacitor 230,
$i_{GD}$ for the current component through resistor 720 to ground,
$i_c$ for the current component which flows through pull-up resistor 712 to capacitor 230,
t for time, and
T for temperature.

The voltage drop across the pull-up resistance $R_1$, $V_{DD}-V_c$, is equal to $(i_{GD}+i_c)R_1$. Since $i_{GD}$ is equal to $V_c/R_2$, then the charging current $i_c$ can be expressed as $$i_c = \frac{V_{DD}R_2 - V_cR_2 - V_cR_1}{R_1R_2}.$$

An intuitive way to regard this is in terms of a Thevenin equivalent circuit, where capacitor C is connected through a resistance $R_{Th}$ to an equivalent voltage source $V_{Th}$. For the charging circuit described, $R_{Th}$ is equal to the resistance which would result if $R_1$ and $R_2$ were connected in parallel, namely $R_1R_2/(R_1+R_2)$, and $V_{Th}$ is equal to $$V_{Th} = V_{DD}\frac{R_2}{R_1 + R_2}.$$

Using this model, it may be seen that the Thevenin resistance $R_{Th}$ will increase with temperature, which would tend to reduce the charging current $i_c$; but the Thevenin source voltage *increases* with temperature, which tends to increase the charging current $i_C$. Thus, these two countervailing effects produce reduced temperature dependence.

The voltage $V_c$ on capacitor 230 will be equal to the integral of the charging current $i_c$ divided by the capacitance C. This relationship can be solved to define $V_c$ as a function of time:

$$V_c(t) = V_{DD}\left(\frac{R_2}{R_1 + R_2}\right)\left(1 - \exp\left(\frac{-t}{R_{Th}C}\right)\right).$$

For assessing temperature dependence, the critical delay is the time ($t_{trip}$) until the trip point of inverter 741 is reached. This will occur at about half $V_{DD}$, so, setting $V_c = V_{DD}/2$ and solving for t, we have $$t_{trip} = -R_{Th}C\left(1 - \ln\left(\frac{R_2 - R_1}{2R_2}\right)\right).$$

Preferably the quantity $t_{trip}/C$ should not vary with temperature, so we rewrite this relation as $t'(T) = t_{trip}/C = f(T)g(T)$, where $$f(T) = -\ln\left(\frac{R_2(T) - R_1(T)}{2R_2(T)}\right), \text{ and}$$

$$g(T) = \frac{R_2(T)R_1(T)}{R_1(T) + R_2(T)}.$$

To examine the temperature dependence of this quantity, we show the temperature dependence of resistances $R_1$ and $R_2$, using their TCRs, as $R_1(T) = R_1(O)(1+Tk_1)$ and $R_2(T) = R_2(O)(1+Tk_2)$. We therefore have $$\frac{dt'}{dT} = g(T)\frac{df(T)}{dT} + f(T)\frac{dg(T)}{dT}, \text{ and}$$

$$\frac{df(T)}{dT} = \frac{-R_1((k_2(1 + Tk_1) + (k_1(1 + Tk_2))}{(1 + Tk_2)(R_2(1 + Tk_1) - R_1(1 + Tk_2))}, \text{ and}$$

$$\frac{dg(T)}{dT} = \frac{R_1R_2(R_1k_2(1 + Tk_1)^2 + (R_2k_1(1 + Tk_2)^2)}{(R_1(1 + Tk_1) + R_2(1 + Tk_2))^2}.$$

Now, for positive resistances and TCRs, g(T) and its derivative will always be positive. (This simply says that the $R_{Th}$ is increasing with T.) Since $R_2$ is greater than $R_1$, f(T) will also be positive. Finally, if we require that $$\frac{R_2}{R_1} > \frac{(1 + Tk_2)}{(1 + Tk_1)},$$

then the derivative of f(T) will always be negative. Thus, it may be seen that the derivative of t' with respect to temperature is the sum of a positive and a negative quantity. By picking the values of $R_1$ and $R_2$ appropriately, the derivative of t' with respect to temperature can be made to be positive, negative, or zero.

In the presently preferred embodiment, $R_2$ is about 8,000 ohms, and $R_1$ is about 3,800 ohms. (The on-state resistance of transistor 714 is only a few hundred ohms, so the temperature dependence of resistor 712 dominates.) The resistor values are laser-trimmable, so the above values are merely illustrative, even within the preferred physical embodiment.

Figure 4A:
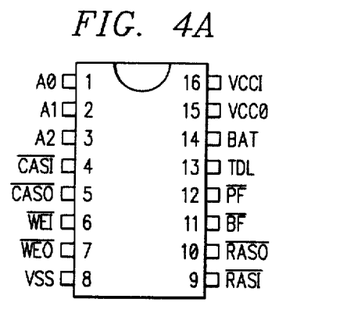
FIGS. 4A and 4B show two different pin assignments for a DIP package containing the controller chip of the presently preferred embodiment.
Figure 4B:
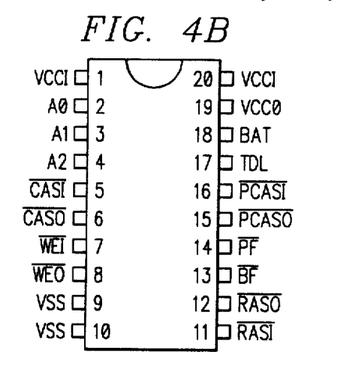

FIGS. 4A and 4B show the package pin-outs of two versions of the presently preferred embodiment of the controller chip. Note that, in the 20 pin package of FIG. 4B, signals PCASI* and PCASO* have been added. (These are used in a 9-DRAM configuration, to permit parity control signals to be separately brought out.) By contrast, in the package configuration of FIG. 4A, the PCASI* and PCASO* signals are not brought out.

FIG. 5 shows the overall system configuration of a memory subsystem according to the presently preferred embodiment. The example shown includes one controller chip 500, and a bank of eight DRAMs 520. These eight DRAMs are preferably used to provide a byte-wide output, i.e. to read or write eight bits simultaneously whenever a read or write access occurs. This means that the RAS* and CAS* lines can be connected in parallel to all of the chips. Alternatively, the controller chip described can be used with a bank of nine DRAMs, rather than with a bank of eight DRAMs. In this case, the bank of nine DRAMs would be used with parity generation and check logic, so that, again, data would be written in and read out in a byte-wide format.

Note that a capacitor 530 is preferably tied to the VCCO line. In the presently preferred embodiment, this is a reasonably large capacitor (e.g. 500 microFarads). This capacitor serves to lower the effective output impedance of the regulated power supply which generates the VCCO supply voltage during the battery-operated mode.

Preferably a rechargeable battery is used, with a separate battery charge isolation circuit which permits the battery to be charged from a high voltage system line. (Many PC systems have a high supply voltage (typically +15 volts) available internally.) However, in the presently preferred embodiment, this circuitry is not included in the controller chip. Instead, this simple circuitry would be built on the system board or on the module.

Figure 6:
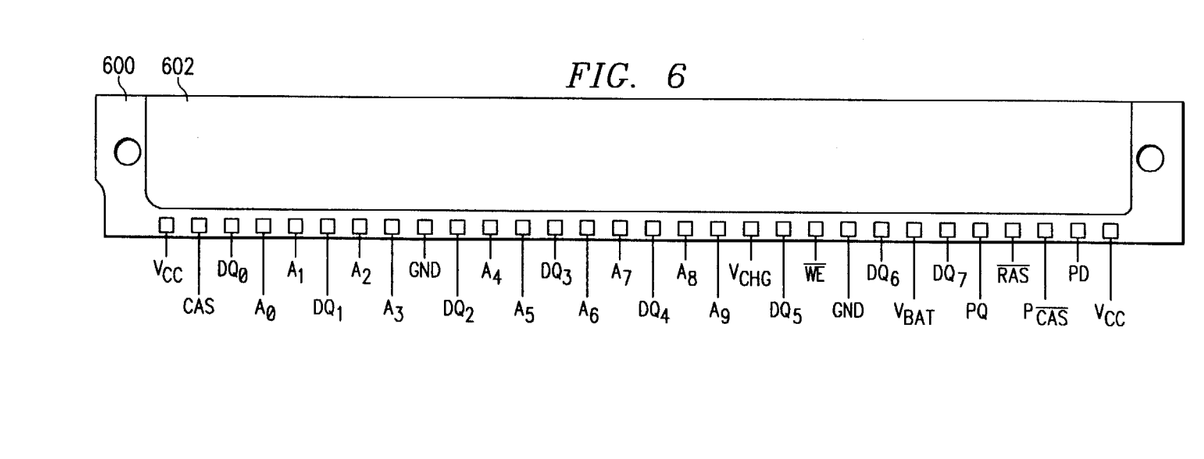
FIG. 6 generally shows the physical configuration of one example of a nonvolatile memory module enabled by the present invention.

FIG. 6 generally shows the physical configuration of one example of a nonvolatile memory module enabled by the present invention. A module card 600 carries, inside its cover 602, a bank of eight DRAM chips, a controller chip implementing the functions described above, a capacitor, and a battery.

Thus, the innovative configuration of this oscillator provides a temperature-independent net output. Preferably, the values are adjusted so that the oscillator period decreases slightly with temperature to compensate for the increased delay in the associated logic stages. Optionally, in oscillator 310, values may be selected so that the oscillator frequency increases significantly as temperature rises, to compensate for the higher leakage current in the DRAMs.

It should also be noted that other elements, having a higher effective TCR than the minimum TCR available, could be substituted for the pull-down resistor to provide improved temperature dependence. For example, alterative and less preferable embodiments permit diodes or transistors to be included in the pull-down resistance.

It will be recognized by those skilled in the art that a tremendous variety of modifications and variations may be introduced in the presently preferred embodiment. For example, many different memory chip sizes, and memory module configurations, could be used. Moreover, the present invention can also be adapted to provide nonvolatility in refreshable dynamic circuits other than DRAMs.

What is claimed is:

1. An integrated circuit memory controller, comprising:
   connections for system power supply input, battery input, and power supply output;
   connections for refresh control signal input and output;
   switching circuitry which,
      in a first mode of operation, connects said input power supply connection to said output power supply connection, and connects said refresh control signal input to said refresh control signal output,
      and, in a second mode of operation, disconnects said input power supply connection from said output power supply connection, and disconnects said refresh control signal input from said refresh control signal output;
   voltage regulator circuitry which, in said second mode of operation, provides a regulated voltage, derived from said battery input, to said power supply output connections; and
   refresh control signal generation logic which, in said second mode of operation, provides refresh control signals, with appropriate timing to preserve data in DRAMs of a predetermined type, to said refresh control signal output.

2. The controller of claim 1, wherein said controller is programmable to define whether refresh control signals are to be applied to said DRAMs if the system power supply fails.

3. The controller of claim 1, further comprising a bandgap voltage reference, and a monitor circuit which tests the system power supply voltage with reference to said bandgap voltage reference; and wherein, when said monitor circuit detects that the system power supply voltage has declined below a predetermined acceptable range, said monitor circuit can cause said switching circuitry, said voltage regulator circuitry, and said refresh control signal generation logic to change from said first mode to said second mode.

4. The controller of claim 1, wherein said refresh control signal generation logic comprises a temperature-compensated oscillator, and controls the timing of said refresh control signals with reference to said oscillator.

5. The integrated circuit memory controller of claim 1, wherein said refresh control signal generation logic does not supply address signals to said DRAM chips with said refresh control signals.

6. The integrated circuit memory controller of claim 1, wherein said voltage regulator circuitry further comprises a trimmable resistor network.

7. The integrated circuit memory controller of claim 1, wherein said voltage regulator circuitry operates with at least about 40 mV of hysteresis.

8. The integrated circuit memory controller of claim 1, wherein said refresh control signal input is connected to receive at least a row-address-strobe signal and a column-address-strobe signal.

9. The integrated circuit memory controller of claim 1, wherein said refresh control signal input is connected to receive at least a write-enable signal, a row-address-strobe signal, and a column-address-strobe signal.

10. The integrated circuit memory controller of claim 1, wherein said refresh control signal input is connected to receive at least four signal lines.

11. A computer system, comprising:
   at least one input device;
   at least one output device;
   at least one processor unit, operatively connected to said input and output devices;

a power supply, which provides a system supply voltage on at least one system supply voltage line;
at least one battery;
and at least one memory subsystem, accessible by said processor unit comprising:
 a plurality of dynamic random access memories (DRAMs) having input connections to receive refresh control signals and power supply; and
 a controller;
 wherein said controller is connected and programmed to connect said system supply voltage line to said power supply connections of said DRAMs under normal operating conditions;
 wherein said controller is also connected and programmed to receive and regulate the output of said battery to thereby provide a supply voltage output to said power supply connections of said DRAMs when a failure of the system supply voltage occurs;
 and wherein said controller provides refresh control signals, with appropriate timing, to said DRAMs when a failure of the system supply voltage occurs.

12. The system of claim 11, wherein individual ones of said memory subsystems are separately mounted on individual physical modules.

13. The system of claim 11, wherein individual ones of said memory subsystems, each including at least four said DRAMs, are separately mounted on individual physically separate modules.

14. The system of claim 11, wherein said DRAM chips do not require externally supplied row addresses for refresh.

15. The system of claim 11, wherein said DRAM chips are connected to receive row-address-strobe and column-address-strobe signals from said controller, and wherein said DRAM chips are internally configured to begin a refresh cycle upon receiving a column-address-strobe-before-row-address-strobe signal sequence.

16. The system of claim 11, wherein said controller does not supply address signals to said DRAM chips with said refresh control signals.

17. The system of claim 11, wherein each of said subsystems includes nine of said DRAMs.

18. The system of claim 11, wherein individual ones of said subsystems, each including one of said controller chips and nine of said DRAMs, are separately mounted on individual physically separate modules.

19. The system of claim 11, wherein said battery has an operating voltage which is higher than the highest normal value of the system power supply.

20. The system of claim 11, further comprising a capacitor connected to said supply voltage output.

21. The system of claim 11, wherein, immediately upon detection of a power failure, said controller provides a burst of said refresh control signals, including a number sufficient to refresh all rows of said memories, as an output to the memories.

22. The system of claim 11, wherein said battery has an operating voltage which is higher than the highest normal value of the system power supply, and wherein said controller regulates the output of said battery with reference to a bandgap-voltage reference circuit.

23. The system of claim 11, wherein, after a power failure has occurred and has ended, said controller provides a continuous series of said refresh control signals as an output to said memories.

24. The system of claim 11, wherein said controller further comprises connections for refresh control signal input and output, and wherein said refresh control signal input is connected to receive at least four signal lines.

25. The system of claim 11, wherein said controller further comprises connections for refresh control signal input and output, and wherein said refresh control signal input is connected to receive at least four signal lines, and wherein, when no power failure has been detected, said controller connects said refresh control signal input through to said refresh control signal output.

26. An integrated circuit memory controller, for connection to a plurality of dynamic random access memories, to a battery, to a system power supply, and to leads for system-generated refresh timing signals, comprising:
 monitor circuitry, which monitors the absolute level of said system power supply voltage, and generates a failure-detect signal to indicate when the system power supply voltage is no longer within an acceptable range;
 voltage regulator circuitry which, when the system power supply has departed from said acceptable range, provides a regulated voltage, derived from the battery, as a power supply output to the memories; and
 refresh control signal generation logic which, when the system power supply has departed from said acceptable range, provides refresh control signals, with appropriate timing to preserve data, as an output to the memories.

27. The controller of claim 26, further comprising a bandgap voltage reference; and wherein said monitor circuitry tests the system power supply voltage with reference to a bandgap voltage reference.

28. The integrated circuit memory controller of claim 26, wherein said refresh control signal generation logic does not supply address signals to said DRAM chips with said refresh control signals.

29. The integrated circuit memory controller of claim 26, wherein said voltage regulator circuitry further comprises a trimmable resistor network.

30. The integrated circuit memory controller of claim 26, wherein said voltage regulator circuitry operates with at least about 40 mV of hysteresis.

31. The integrated circuit memory controller of claim 26, wherein, immediately upon departure of the system power supply from said acceptable range, said refresh control signal generation logic provides a burst of said refresh control signals, including enough of said refresh control signals to refresh all rows of said memories, as an output to the memories.

32. The integrated circuit memory controller of claim 26, wherein, whenever said monitor circuitry indicates that the system power supply voltage has returned to said acceptable range after having been outside of said acceptable range, said refresh control signal generation logic thereupon begins to provide a continuous series of said refresh control signals as an output to the memories.

33. An integrated circuit memory controller, for connection to a plurality of dynamic random access memories, to a battery, to a system power supply, and to leads for system-generated refresh timing signals, comprising:
 monitor circuitry, which monitors the absolute level of said system power supply voltage with reference to a bandgap voltage reference, and generates a failure-detect signal to indicate when the system power supply voltage is no longer within an acceptable range;

voltage regulator circuitry which,
- if power-fail protection has been enabled and the system power supply voltage has departed from said acceptable range, or
- if power-fail protection has been enabled and the system power supply voltage is within said acceptable range AND a predetermined control signal, which indicates that the system will resume control of the refresh control signals, has not been received since the system power supply voltage returned to said acceptable range,
- provides a regulated voltage, derived from the battery, to the memories in place of the system supply voltage; and refresh control signal generation logic which,
- if power-fail protection has been enabled and the system power supply voltage has departed from said acceptable range, or
- if power-fail protection has been enabled and the system power supply voltage is within said acceptable range AND said predetermined control signal has not been received since the system power supply voltage returned to said acceptable range,
- provides refresh control signals, with appropriate timing, to the memories in place of the system-generated refresh timing signals.

34. The controller of claim 33, wherein said predetermined control signals comprise a serial stream of more than 16 bits of data.

35. The integrated circuit memory controller of claim 33, wherein said predetermined control signals comprise more than 16 bits of data on two or more lines.

36. The integrated circuit memory controller of claim 33, wherein said predetermined control signals comprise more than 16 bits of data on two or more address lines.

37. The integrated circuit memory controller of claim 33, wherein, if power-fail protection has been enabled and if the system power supply voltage is within said acceptable range and if said predetermined control signal has not been received since the system power supply voltage returned to said acceptable range, said refresh control signal generation logic provides a continuous series of said refresh control signals as an output to the memories.

38. The integrated circuit memory controller of claim 33, wherein said refresh control signal generation logic does not supply address signals to said DRAM chips with said refresh control signals.

39. The integrated circuit memory controller of claim 33, wherein said voltage regulator circuitry further comprises a trimmable resistor network.

40. The integrated circuit memory controller of claim 33, wherein said voltage regulator circuitry operates with at least about 40 mV of hysteresis.

41. An integrated circuit memory controller, for attachment to a plurality of dynamic random access memories, to a battery, to a system power supply, and to leads for system-generated refresh timing signals, comprising:
- connections for system power supply input, battery input, and power supply output;
- connections for refresh control signal input and output;
- monitor circuitry, which includes a bandgap voltage reference, and which monitors the absolute level of said system power supply voltage, and which generates a failure-detect signal to indicate when the system power supply voltage is no longer within an acceptable range;
- switching circuitry which,
  - during normal operation, connects said input power supply connection to said output power supply connection, and connects said refresh control signal input to said refresh control signal output, and,
  - when the system power supply has departed from said acceptable range, disconnects said input power supply connection to said output power supply connection, and at least partially disconnects said refresh control signal input from said refresh control signal output; and
- voltage regulator circuitry
  - which, when the system power supply has departed from said acceptable range, provides a regulated voltage, derived from the battery, to said output power supply connection,
  - and which is configured to operate with at least about 40 mV of hysteresis,
  - and which further comprises a trimmable resistor network; and
- refresh control signal generation logic
  - which comprises a temperature-compensated oscillator,
  - and which, when the system power supply has departed from said acceptable range, provides refresh control signals, with appropriate timing to preserve data, in DRAMs of a predetermined type, as an output to the memories,
  - wherein said refresh control signal generation logic does not supply address signals to said DRAM chips with said refresh control signals;
- wherein said refresh control signal input is connected to receive at least four signal lines, including at least a write-enable signal, a row-address-strobe signal, and a column-address-strobe signal;
- and wherein, whenever said monitor circuitry indicates that the system power supply voltage has returned to said acceptable range after having been outside of said acceptable range, said refresh control signal generation logic thereupon begins to provide a continuous series of said refresh control signals as an output to the memories.

42. A computer system, comprising:
- at least one input device;
- at least one output device;
- at least one processor unit;
- a power supply, which provides a system supply voltage on at least one system supply voltage line;
- at least one battery, which has an operating voltage which is higher than
- the highest normal value of the system power supply voltage;
- and at least one memory subsystem comprising:
  - at least nine dynamic random access memories (DRAMs),
    - having input connections to receive row-address-strobe and column-address-strobe signals,
    - said DRAM chips being internally configured to begin a refresh cycle upon receiving a column-address-strobe-before-row-address-strobe signal sequence, said DRAMs being of a kind which does not require externally supplied row addresses for refresh; and a controller, comprising connections for refresh control signal input and output, and wherein said refresh control signal input includes at least four signal lines, including row-address-strobe and column-address-strobe signals, and wherein, when no power failure has been detected, said controller connects said refresh control signal input through to said refresh control signal output;

wherein said controller is connected and programmed to connect said system supply voltage line to said power supply connections of said DRAMs under normal operating conditions;

wherein said controller is also connected and programmed to receive and regulate the output of said battery, with reference to a bandgap voltage reference circuit, to thereby provide a supply voltage output to said power supply connections of said DRAMs when a power failure has been detected, said supply voltage output having a discrete capacitor connected thereto;

and wherein said controller provides refresh control signals, with appropriate timing, to said DRAMs, when a power failure has been detected, if said controller has been programmed to apply refresh control signals to said DRAMs if the system power supply fails;

individual ones of said memory subsystems being separately mounted on individual physically separate modules.

43. An integrated circuit memory controller, for attachment to a plurality of dynamic random access memories, to a battery, to a system power supply, and to leads for system-generated refresh timing signals, comprising:

monitor circuitry, which monitors the absolute level of said system power supply voltage with reference to a bandgap voltage reference, and generates a failure-detect signal to indicate when the system power supply voltage is no longer within an acceptable range;

voltage regulator circuitry, which comprises a bandgap voltage reference circuit, and which provides a regulated voltage, derived from the battery, to the memories in place of the system supply voltage, if either of the following conditions occur;

if power-fail protection has been enabled and the system power supply voltage has departed from said acceptable range, or if power-fail protection has been enabled and the system power supply voltage is within said acceptable range and a predetermined control signal, which indicates that the system will resume control of the refresh control signals, has not been received since the system power supply voltage returned to said acceptable range;

refresh control signal generation logic which, if power-fail protection has been enabled and if the system power supply voltage has departed from said acceptable range, provides refresh control signals, with appropriate timing, to the memories in place of the system-generated refresh timing signals, said refresh control signals not including row addresses;

and which, if power-fail protection has been enabled and the system power supply voltage is within said acceptable range and said predetermined control signal has not been received since the system power supply voltage returned to said acceptable range, provides a continuous series of said refresh control signals as an output to the memories.

* * * * *